(12) United States Patent
Tabuchi

(10) Patent No.: US 7,579,286 B2
(45) Date of Patent: Aug. 25, 2009

(54) METHOD OF FABRICATING A SEMICONDUCTOR DEVICE USING PLASMA TO FORM AN INSULATING FILM

(75) Inventor: Kiyotaka Tabuchi, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 11/169,604

(22) Filed: Jun. 29, 2005

(65) Prior Publication Data

US 2006/0024979 A1  Feb. 2, 2006

(30) Foreign Application Priority Data

Jul. 7, 2004  (JP)  ............................ P2004-200179

(51) Int. Cl.
*H01L 21/469* (2006.01)
(52) U.S. Cl. ................ 438/788; 438/789; 257/E21.278
(58) Field of Classification Search ................. 438/788, 438/789; 257/E21.278
See application file for complete search history.

(56) References Cited

U.S. PATENT DOCUMENTS

| | | | | |
|---|---|---|---|---|
| 4,877,641 | A * | 10/1989 | Dory | 427/574 |
| 5,405,808 | A * | 4/1995 | Rostoker et al. | 29/841 |
| 5,876,753 | A * | 3/1999 | Timmons et al. | 427/488 |
| 6,041,734 | A * | 3/2000 | Raoux et al. | 118/723 E |
| 6,096,564 | A * | 8/2000 | Denes et al. | 438/1 |
| 6,147,009 | A * | 11/2000 | Grill et al. | 438/780 |
| 6,441,491 | B1 * | 8/2002 | Grill et al. | 257/759 |
| 6,497,963 | B1 * | 12/2002 | Grill et al. | 428/446 |
| 6,541,398 | B2 * | 4/2003 | Grill et al. | 438/780 |
| 6,572,923 | B2 * | 6/2003 | Ma et al. | 427/255.27 |
| 6,805,139 | B1 * | 10/2004 | Savas et al. | 134/1.3 |
| 2003/0049460 | A1 * | 3/2003 | O'Neill et al. | 428/426 |
| 2003/0064154 | A1 * | 4/2003 | Laxman et al. | 427/255.28 |
| 2003/0100190 | A1 * | 5/2003 | Cote et al. | 438/710 |
| 2003/0139062 | A1 * | 7/2003 | Grill et al. | 438/778 |
| 2003/0143865 | A1 * | 7/2003 | Grill et al. | 438/780 |

(Continued)

FOREIGN PATENT DOCUMENTS

JP  2002-256434  9/2002

(Continued)

OTHER PUBLICATIONS

Japanese Office Action issued on Apr. 8, 2008.

*Primary Examiner*—Michelle Estrada
*Assistant Examiner*—Jarrett J Stark
(74) *Attorney, Agent, or Firm*—Sonnenschein Nath & Rosenthal LLP

(57) ABSTRACT

A fabrication method of a semiconductor device is disclosed by which damage to another film or exfoliation of a film is prevented and an insulating film having a dielectric constant of 2.5 or less can be formed while a film strength is maintained without deteriorating a wiring line characteristic. According to an embodiment, an insulating film is formed on a substrate by a plasma process, which uses film-forming gas having a ring structure of Si—O bonds, such that it maintains the ring structure of the Si—O bonds. According to another embodiment, an insulating film is formed on a substrate by a plasma process, which uses film-forming gas which contains silane-containing gas and oxygen gas or film-forming gas which contains Si—O bond-containing gas, such that it has a ring structure of the Si—O bonds.

1 Claim, 1 Drawing Sheet

U.S. PATENT DOCUMENTS

| | | | |
|---|---|---|---|
| 2003/0162034 A1* | 8/2003 | O'Neill et al. | 428/426 |
| 2003/0198742 A1* | 10/2003 | Vrtis et al. | 427/255.28 |
| 2004/0137243 A1* | 7/2004 | Gleason et al. | 428/447 |
| 2005/0022839 A1* | 2/2005 | Savas et al. | 134/1.2 |
| 2005/0079717 A1* | 4/2005 | Savas et al. | 438/689 |

FOREIGN PATENT DOCUMENTS

| | | |
|---|---|---|
| JP | 2005-051192 | 2/2005 |
| WO | 04/001815 | 12/2003 |

\* cited by examiner

METHOD OF FABRICATING A SEMICONDUCTOR DEVICE USING PLASMA TO FORM AN INSULATING FILM

RELATED APPLICATION DATA

The present application claims priority to Japanese Application(s) No(s). P2004-200179 filed Jul. 7, 2004, which application(s) is/are incorporated herein by reference to the extent permitted by law.

BACKGROUND OF THE INVENTION

This invention relates to a fabrication method of a semiconductor device, and more particularly to a fabrication method of a semiconductor device having a multilayer wiring line structure wherein an insulating film having a dielectric constant lower than that of a silicon (Si) oxide film is used as an interlayer insulating film.

In a multilayer wiring line structure of a CMOS semiconductor device, the problem of signal propagation delay has become conspicuous together with requirements for high speed processing and low power consumption of a device in recent years. In order to suppress increase of the signal propagation delay, it is necessary to achieve reduction in resistance of wiring lines and capacitance between wiring lines and capacitance between wiring line layers.

As regards reduction in resistance of wiring lines, a semiconductor device which uses copper (Cu) wiring lines having a resistance lower than that of conventionally used aluminum alloy wiring lines is practically used.

Meanwhile, as regards reduction in capacitance between wiring lines and in capacitance between wiring line layers, a silicon oxide film having a dielectric constant higher than 4 has formerly been used as an interlayer insulating film. However, a SiOC film having a dielectric constant of approximately 3 has been placed into practical use in accordance with a request for reduction of the dielectric constant. Further, in recent years, a multilayer wiring line structure wherein a SiOC film is used as an interlayer insulating film has been placed into practical use.

The SiOC film is formed by a plasma CVD method (Chemical Vapor Deposition) and contains a methyl ($CH_3$) group whose polarizability is lower than that of oxygen (O) so that the dielectric constant may be lowered from that of $SiO_2$ films. However, since refinement of semiconductor devices in the future is estimated, it is necessary to reduce the dielectric constant of interlayer insulating films to a level lower than 2.5 and to further increase the introduction ratio of a $CH_3$ group.

A method of reducing the dielectric constant of interlayer insulating films to a level lower than 2.5 has been proposed. In the method, another member which serves as a source of holes called porogen is introduced into solution for an organic film such as methylsilsesquioxane (MSQ) to form an organic film and then the porogen is removed by heat treatment or the like. As holes are introduced into the organic film, the film density of the interlayer film becomes coarser and reduction of the dielectric constant can be anticipated. For the film formation, both of a rotary application method and a plasma CVD method have been proposed.

Further, as another method of reducing the dielectric constant of interlayer insulating films to a level lower than 2.5, it has been proposed to form a CF film by a plasma CVD method. The fluorine (F) is an element whose polarizability is very low and is effective to reduce the dielectric constant, and where a CF film is used, an interlayer insulating film having a dielectric constant of approximately 2 can be obtained without introducing holes therein. The method is disclosed, for example, in Japanese Patent Laid-Open No. Hei 10-144675 (hereinafter referred to as Patent Document 1).

SUMMARY OF THE INVENTION

However, where a SiOC film is formed as an interlayer insulating film, as the introduction ratio of a $CH_3$ group increases, the dielectric constant decreases, but since the film density becomes coarser, the film strength becomes lower. Where such a multilayer wiring line structure as described above is formed, a groove pattern which is to make a wiring line groove is formed on an interlayer insulating film first, and then a conductive film is formed on the interlayer insulating film in such a condition that the groove pattern is filled up with the conductive film. Thereafter, the conductive film is removed until the surface of the interlayer insulating film is exposed by a CMP method (Chemical Mechanical Polishing) or the like to form a wiring line in the groove pattern. Therefore, the introduction of a $CH_3$ group must be suppressed to such a degree that the interlayer insulating film has a mechanical strength sufficient to withstand such a wiring line formation process as just described, and the introduction of a $CH_3$ group into a silicon oxide film fails to reduce the dielectric constant to a level lower than 2.5. Further, where an interlayer insulating film is formed by an ordinary plasma CVD method, since all bonds of components which compose film-forming gas are dissociated, it is difficult to control the introduction ratio of a $CH_3$ group.

Further, since the introduction of holes into an organic film significantly decreases the film strength, when such a wiring line formation process as described above or packaging is performed, destruction or exfoliation of the interlayer insulating film is caused by the holes. It is considered that this arises not only from the fact that the film density is lowered but also from the fact that, since portions which should originally be bonded are cut off by the porogen, the interlayer insulating film is weakened also in structure. On the other hand, where the rotary application method is used to form an organic film, heat treatment for hardening the organic film is required. However, Cu which is used for wiring lines is liable to migrate also at a low temperature, and as Cu migrates, voids are generated. Consequently, deterioration of a wiring line characteristic such as deterioration of the migration resisting property is liable to occur.

In the meantime, where a plasma CVD method is used to form a CF film, since a C—C bond and a C—F bond which form the CF film have binding energy of similar levels, as film-forming gas is excited and dissociated in plasma to form a film, there is a tendency that F is liable to be dissociated from the formed film. Further, since F is very liable to react with water ($H_2O$) or oxygen ($O_2$) in the air, the dissociated F reacts with the oxygen, $H_2O$ and so forth in the air to cause dissociation of HF and F. Therefore, there is a problem that such HF or F is dispersed and taken in by another film thereby to damage the film or cause exfoliation of the film.

From the foregoing, a fabrication method of a semiconductor device is demanded by which an interlayer insulating film which has a dielectric constant reduced to a level lower than 2.5 and maintains a sufficient film strength can be formed even if a CF film is not used and deterioration of a wiring line characteristic can be prevented.

In order to solve the subject described above, according to an embodiment of the present invention, there is provided a fabrication method of a semiconductor device, including a step of forming an insulating film on a substrate by a plasma process, in which film-forming gas having a ring structure of Si—O bonds is used, such that the insulating film maintains the ring structure of the Si—O bonds.

According to the fabrication method of a semiconductor device, since an insulating film is formed on a substrate such that it maintains a ring structure of Si—O bonds, holes are formed in the insulating film by the ring structure of Si—O bonds. Consequently, the film density becomes coarser, and reduction of the dielectric constant of the insulation film can be achieved even if such a CF film as described in the background of the invention hereinabove is not used. Further, since the Si—O bonds have high binding energy, the ring structure of Si—O bonds is stable in structure, and consequently, also the film strength is maintained. Further, since a plasma process is used for the film formation, there is no necessity to perform a heat treatment step for hardening the film itself when compared with an alternative case wherein a rotary application method is used for the film formation. Consequently, appearance of voids by migration of Cu, for example, in wiring lines made of Cu is prevented, and deterioration of a wiring line characteristic such as a migration withstanding property is prevented.

The fabrication method of a semiconductor device may be configured such that the film-forming gas has the ring structure of the Si—O bonds and at least one of Si—C bonds and C—O bonds, and the insulating film is formed on the substrate by the plasma process such that the ring structure of the Si—O bonds is maintained while the Si—C bonds and/or the C—O bonds are partly dissociated. In this instance, since the Si—C bonds and the C—O bonds are partly dissociated, C-containing groups having a polarizability lower than that of O, that is, alkyl groups or alkoxyl groups, are introduced into the insulating film. Therefore, further reduction of the dielectric constant of the insulating film can be anticipated also by introduction of the C-containing groups into the insulating film.

According to another embodiment of the present invention, there is provided a fabrication method of a semiconductor device, including a step of forming an insulating film on a substrate by a plasma process, in which film-forming gas which contains silane-containing gas and oxygen gas or film-forming gas which contains Si—O bond-containing gas is used, such that the insulating film has a ring structure of the Si—O bonds.

According to the fabrication method of a semiconductor device, a plasma process is used to form a ring structure of Si—O bonds in a vapor phase and an insulating film is formed on a substrate while the ring structure is maintained. Consequently, since holes are formed in the insulating film by the ring structure of Si—O bonds, the film density becomes coarser, and reduction of the dielectric constant of the insulating film can be achieved even if such a CF film as described in the background of the invention hereinabove is not used. Further, since the Si—O bonds have high binding energy, the ring structure of the Si—O bonds is stable in structure, and consequently, also the film strength is maintained. Furthermore, since the plasma process is used for the film formation, deterioration of a wiring line characteristic such as a migration withstanding property can be prevented similarly as in the fabrication method of the first embodiment described above.

The fabrication method of a semiconductor device may be configured such that the silane-containing gas or the Si—O bond-containing gas has at least one of Si—C bonds and C—O bonds, and the insulating film is formed on the substrate by the plasma process such that the Si—C bonds and/or the C—O bonds are partly dissociated while the insulating film has the ring structure of the Si—O bonds. In this instance, since the Si—C bonds and the C—O bonds are partly dissociated, C-containing groups having a polarizability lower than that of O, that is, alkyl groups or alkoxyl groups, are introduced into the insulating film. Therefore, further reduction of the dielectric constant of the insulating film can be anticipated also by introduction of the C-containing groups into the insulating film.

In summary, with the fabrication methods of a semiconductor device according to the present invention, reduction of the dielectric constant of an insulating film can be achieved even if a CF film is not used, and an insulating film having a dielectric constant of 2.5 or less can be formed. Consequently, damage to another film or exfoliation of a film by F can be prevented, and the capacitance between wiring lines and the capacitance between wiring line layers can be reduced with certainty. Further, since also the film strength of the insulating film is maintained, the insulating film formed has a mechanical strength sufficient to withstand a wiring line process or packaging, and deterioration of a wiring line characteristic can be prevented.

Accordingly, high-density high-speed CMOS devices can be implemented, and the performances of computers, game machines and mobile produces which incorporate semiconductor devices fabricated by the fabrication method can be enhanced significantly.

The above and other objects, features and advantages of the present invention will become apparent from the following description and the appended claims, taken in conjunction with the accompanying drawings in which like parts or elements denoted by like reference symbols.

DETAILED DESCRIPTION OF THE PREFERRED EMBODIMENTS

Figure 1:
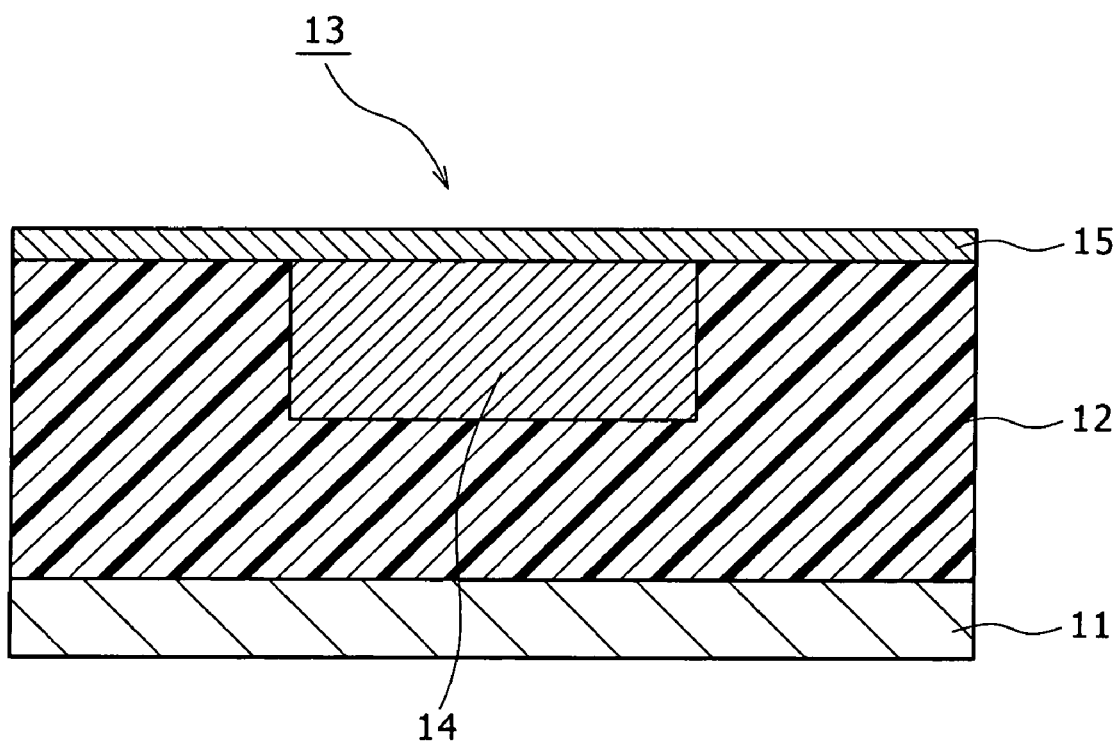
FIG. 1 is a schematic sectional view illustrating a fabrication method of a semiconductor device to which the present invention is applied.

FIG. 1 shows in cross section a semiconductor device fabricated by a fabrication method to which the present invention is applied. Referring to FIG. 1, according to the fabrication method of the embodiment of the present invention, an interlayer insulating film 12 having, for example, a four-membered ring structure (cyclotetra siloxane) of Si—O bonds is formed on a substrate 11 on which semiconductor elements and so forth are formed.

In this instance, film-forming gas contains, for example, organic silane gas composed of octamethyl cyclotetra siloxane (OMCTS) represented by the formula (1) given below. The OMCTS has a four-membered ring structure of Si—O bonds, and includes two $CH_3$ groups bonded to Si atoms which form the four-membered ring structure and has Si—C bonds. The Si—O bonds which compose the OMCTS has binding energy higher than that of the Si—C bonds.

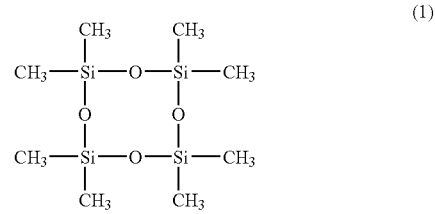

(1)

Incidentally, the interlayer insulating film 12 is formed by a plasma CVD method wherein the energy is controlled so that the Si—O bonds in the OMCTS are maintained while the Si—C bonds having binding energy lower than that of the Si—O bonds are partly dissociated.

Consequently, since the interlayer insulating film 12 is formed in a state wherein the four-membered ring structure of the Si—O bonds is maintained, holes of the ring structure are formed in the interlayer insulating film 12. Further, since the Si—C bonds are partly dissociated, C-containing groups in the form of a $CH_3$ group are introduced into the interlayer insulating film 12. In this instance, the C-containing groups are preferably introduced within a range within which a mechanical strength of the interlayer insulating film 12 can be obtained, and particularly, the Si—C bonds are preferably dissociated so that C-containing groups are introduced into the interlayer insulating film 12 at an introduction ratio of approximately 30% or less.

Here, the interlayer insulating film 12 is formed by pulse plasma discharge wherein a plasma CVD apparatus is used and a micro ($\mu$) wave is switched on and off and outputted to generate plasma repetitively in a pulse-like fashion. Consequently, since the electron temperature is controlled so as to be lower than that by an ordinary plasma CVD method, such energy control as described above can be achieved.

As an example of film-forming conditions in this instance, OMCTS [flow rate: 100 $cm^3$/min] and oxygen ($O_2$) [flow rate: 10 $cm^3$/min] are used as film-forming gas, and the pressure of the film-forming atmosphere is set to 13 Pa, the RF power of the CVD apparatus to 1,000 W and the $\mu$ wave power to 1,000 W. Then, the time for pulse discharge is set to 20 $\mu$sec and the duty ratio which is a ratio of the $\mu$ wave application time is set to 20%. It is to be noted that the gas flow rate is represented by a volume flow rate in normal conditions. Since the film formation is performed under the film-forming conditions given above, an interlayer insulating film 12 of a dielectric constant of 2.3 having a four-membered ring structure of Si—O bonds can be formed on the substrate 11.

Here, in order to form the interlayer insulating film 12 such that the four-membered ring structure of Si—O bonds in the OMCTS is maintained and the Si—C bonds are partly dissociated, the RF power, $\mu$ wave power and duty ratio of the film-forming conditions described above are adjusted to control the energy of pulse plasma discharge. Particularly by controlling the duty ratio, the energy of pulse plasma discharge can be controlled effectively. Meanwhile, the partial dissociation of the Si—C bonds can be controlled also by adjusting the flow rate of $O_2$ gas in the film-forming gas.

As later steps, a groove pattern 13 which is to make a wiring line groove is formed on the interlayer insulating film 12, and a barrier layer (not shown) is formed on the interlayer insulating film 12 such that it covers an inner wall of the groove pattern 13, whereafter a conductive film of, for example, Cu is formed on the barrier layer such that it fills up the groove pattern 13. Thereafter, for example, a CMP method is applied to grind the conductive film until the surface of the interlayer insulating film 12 is exposed thereby to form a wiring line 14 made of, for example, Cu in the groove pattern 13. Thereafter, a diffusion preventing layer 15 for preventing diffusion of metal from the wiring line 14 is formed on the interlayer insulating film 12 including the wiring line 14, and an upper interlayer insulating film (not shown) is formed on the diffusion preventing layer 15. Also by forming the upper interlayer insulating film such that it has such a ring structure as described hereinabove, reduction in dielectric constant of the upper interlayer insulating film can be achieved advantageously.

As described above, according to the fabrication method of a semiconductor device having such a configuration as described above, film-forming gas which contains OMCTS having a four-membered ring structure of Si—O bonds is used to form an interlayer insulating film 12 on a substrate 11 such that the four-membered ring structure of the Si—O bonds may be maintained. Therefore, since holes of the ring structure are formed in the interlayer insulating film 12, the film density becomes coarser, and this makes is possible to reduce the dielectric constant of the interlayer insulating film 12. Further, since the Si—C bonds are partly dissociated, a $CH_3$ group having a comparatively low polarizability can be introduced into the interlayer insulating film 12, and consequently, further reduction of the dielectric constant of the interlayer insulating film 12 can be anticipated. Accordingly, even if such a CF film as described hereinabove in connection with the related art is not used, the interlayer insulating film 12 of the dielectric constant of 2.3 can be formed, and consequently, damage to a different film or exfoliation of a film by F can be prevented and the capacitance between wiring lines and the capacitance between wiring line layers can be reduced with certainty.

Further, since the Si—O bond has high binding energy, it is stable in structure, and also the introduction ratio of a $CH_3$ group into the interlayer insulating film 12 can be controlled to a range within which the film strength of the interlayer insulating film 12 is maintained. Consequently, the interlayer insulating film 12 can be formed with a mechanical strength sufficient to withstand a wiring line process such as a CMP method or packaging.

Furthermore, since the interlayer insulating film 12 is formed by pulse plasma discharge, the electron temperature upon the film formation can be controlled low, and when compared with an alternative case wherein the interlayer insulating film 12 is formed by a rotary application method, there is no necessity to perform a heat treatment step. Consequently, appearance of voids arising from migration of Cu in the wiring line 14 by heat treatment can be prevented, and consequently, deterioration of a wiring line characteristic such as a migration withstanding property can be prevented.

Accordingly, high-density high-speed CMOS devices can be implemented, and the performances of computers, game machines and mobile produces which incorporate semiconductor devices fabricated by the fabrication method can be enhanced significantly.

It is to be noted here that, although the interlayer insulating film 12 is formed by a plasma CVD method wherein the energy is controlled so that the four-membered structure of the Si—O bonds is maintained while the Si—C bonds are partly dissociated, the interlayer insulating film 12 may otherwise be formed by another plasma CVD method wherein the energy is controlled so that the four-membered ring structure of Si—O bonds is maintained while all Si—C bonds are dissociated. Also in this instance, since the ring structure of Si—O bonds is maintained, the film density of the interlayer insulating film 12 becomes coarser, and consequently, reduction of the dielectric constant can be achieved. However, preferably the Si—C bonds are partly dissociated such that some Si—C bonds remain because reduction of the dielectric constant of the interlayer insulating film 12 can be achieved also by introduction of a C-containing group.

Modification 1

While, in the first embodiment described above, film-forming gas which contains OMCTS is used, different film-forming gas which contains, for example, tetramethyl cyclotetra siloxane (TMCTS) represented by the formula (2) given below may be used as the film-forming gas which has a ring structure of Si—O bonds. The TMCTS has a four-membered ring structure of Si—O bonds and is configured such that it has a CH$_3$ group and H bonded to Si atoms which form the four-membered ring structure and further has Si—C bonds and Si—H bonds. Here, the Si—O bond has binding energy higher than those of the Si—C bond and the Si—H bond.

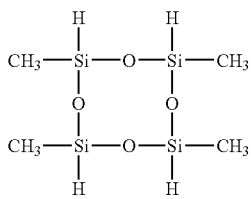

(2)

Also in this instance, film-forming gas which contains, for example, TMCTS and O$_2$ is used and the energy of pulse plasma discharge is controlled so that the four-membered ring structure of Si—O bonds is maintained while Si—C bonds are partly dissociated to form the interlayer insulating film 12. In this instance, since the Si—H bond has binding energy substantially equal to that of the Si—C bond, the Si—H bonds are partly dissociated together with the Si—C bonds. Also with such a fabrication method of a semiconductor device as just described, since CH$_3$ groups can be introduced into the interlayer insulating film 12 within a range within which the film strength is maintained while the four-membered ring structure of Si—O bonds is maintained, similar effects to those of the first embodiment can be exhibited.

It is to be noted that, while, in the first embodiment and the modification thereto described above, film-forming gas which contains OMCTS or TMCTS which has a four-membered ring structure of Si—O bonds and has Si—C bonds wherein Si and CH$_3$ groups are bonded to each other is used, a chemical wherein a C-containing group which has a four-membered ring structure of Si—O bonds and includes not a CH$_3$ group but some other alkyl (C$_x$H$_y$) group is bonded to Si may be used.

Further, as the film-forming gas, another chemical may be used which has a four-membered ring structure of Si—O bonds and has C—O bonds wherein a C-containing group which may be an alkoxyl (C$_x$H$_y$O) group is bonded to Si. In this instance, the C—O bond has binding energy substantially equal to that of the Si—C bond and the Si—O bond has binding energy higher than that of the C—O bond, similar effects to those of the first embodiment can be exhibited by forming the interlayer insulating film 12 by a plasma CVD method wherein the energy is controlled so that the ring structure of Si—O bonds is maintained while the C—O bonds are partly dissociated.

Further, as the film-forming gas, a chemical may be used which has a four-membered ring structure of Si—O bonds and has both of Si—C bonds and C—O bonds wherein an alkyl (C$_x$H$_y$) group and an alkoxyl (C$_x$H$_y$O) group are bonded to Si. One of such compounds is, for example, tetramethyl tetramethoxy cyclotetra siloxane. In this instance, similar effects to those of the first embodiment are exhibited by forming the interlayer insulating film 12 by a plasma CVD method wherein the energy is controlled so that the ring structure of Si—O bonds is maintained while the Si—C bonds and the C—O bonds are partly dissociated.

Second Embodiment

In the second embodiment of the present invention, film-forming gas different from that used in the first embodiment is used to form an interlayer insulating film 12 having a four-membered ring structure (cyclotetra siloxane) of Si—O bonds on a substrate 11. The film formation when the interlayer insulating film 12 is formed on the substrate 11 in the present embodiment can be performed using film-forming gas which contains silane (Si)-containing gas composed of, for example, trimethyl silane (3MS) represented by the formula (3) given below and O$_2$ gas.

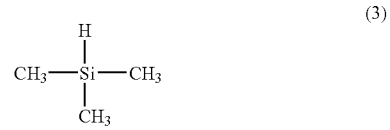

(3)

Here, the formation of the interlayer insulating film 12 is performed by a plasma CVD method wherein the energy is controlled so that Si—C bonds in the 3MS are partly dissociated and Si and O$_2$ react with each other in a vapor phase to form a four-member ring structure of Si—O bonds which are stable in structure and besides the formed four-member ring structure is maintained.

Consequently, since the interlayer insulating film 12 is formed such that it has a four-member ring structure of Si—O bonds, holes of the ring structure are formed in the interlayer insulating film 12. Further, since the Si—C bonds are partly dissociated, C-containing groups formed from a CH$_3$ group are introduced into the interlayer insulating film 12. In this instance, the C-containing groups are preferably introduced within a range within which a mechanical strength of the interlayer insulating film 12 is obtained, and more particularly, the Si—C bonds are preferably dissociated such that the C-containing groups are introduced at an introduction ratio of 30% or less into the interlayer insulating film 12.

Here, the interlayer insulating film 12 is formed by pulse plasma discharge wherein a plasma CVD apparatus is used and a micro (µ) wave is switched on and off and outputted to generate plasma repetitively in a pulse-like fashion similarly as in the first embodiment. Therefore, since the electron temperature is controlled so as to be lower than that by an ordinary plasma CVD method, such energy control as described above can be achieved.

As an example of film-forming conditions in this instance, 3MS [flow rate: 100 cm$^3$/min] and oxygen (O$_2$) [flow rate: 15 cm$^3$/min] are used as film-forming gas, and the pressure of the film-forming atmosphere is set to 13 Pa, the RF power of the CVD apparatus to 1,000 W and the µ wave power to 1,000 W. Then, the time for pulse discharge is set to 20 µsec and the duty ratio which is a ratio of the µ wave application time is set to 18%. As the film formation is performed under the film-forming conditions given above, an interlayer insulating film 12 of a dielectric constant of 2.3 having a four-membered ring structure of Si—O bonds is formed on the substrate 11.

Here, in order to form the interlayer insulating film 12 such that the Si—C bonds are partly dissociated and a four-membered ring structure of Si—O bonds is formed and maintained, the RF power, µ wave power and duty ratio of the film-forming conditions described above are adjusted to control the energy of pulse plasma discharge. Particularly by controlling the duty ratio, the energy of pulse plasma discharge can be controlled effectively. Meanwhile, the partial dissociation of the Si—C bonds can be controlled also by adjusting the flow rate of $O_2$ gas in the film-forming gas.

Later steps are performed in a similar manner as in the first embodiment to form a multilayer wiring line structure.

According to such a fabrication method of a semiconductor device as described above, 3MS and $O_2$ are used as film-forming gas and caused to react with each other in a vapor phase to form a four-membered ring structure of Si—O bonds, and an interlayer insulating film 12 is formed on a substrate 11 while the four-membered ring structure is maintained. Consequently, holes of the ring structure are formed in the interlayer insulating film 12 and make the film density coarser, and this makes it possible to reduce the dielectric constant of the interlayer insulating film 12. Further, since the Si—C bonds are partly dissociated, $CH_3$ groups having a low polarizability can be introduced into the interlayer insulating film 12, and consequently, further reduction of the dielectric constant of the interlayer insulating film 12 can be anticipated. Accordingly, an interlayer insulating film 12 of a dielectric constant of 2.3 can be formed, and similar effects to those of the first embodiment can be exhibited.

It is to be noted here that, although the interlayer insulating film 12 is formed by a plasma CVD method wherein the energy is controlled so that the four-membered structure of Si—O bonds is maintained while the Si—C bonds are partly dissociated, the interlayer insulating film 12 may otherwise be formed by another plasma CVD method wherein the energy is controlled so that the four-membered ring structure of Si—O bonds is maintained while all Si—C bonds are dissociated. Also in this instance, since the ring structure of Si—O bonds is maintained, the film density of the interlayer insulating film 12 becomes coarser, and consequently, reduction of the dielectric constant can be achieved. However, preferably the Si—C bonds are partly dissociated such that some Si—C bonds remain because reduction of the dielectric constant of the interlayer insulating film 12 can be achieved also by introduction of a C-containing group.

Further, while silane-containing gas formed from 3MS is used here, the present invention is not limited to this, and similar effects are exhibited also where some other alkyl silane such as tetramethyl silane (4MS) is used.

Modification 2

Further, such Si—O-containing gas formed from tetraethoxy silane (TEOS) as represented by the formula (4) may be used. Here, the TEOS includes four ethoxy ($C_2H_5O$) groups bonded to Si, and the Si—O bond has binding energy higher than that of the C—O bond.

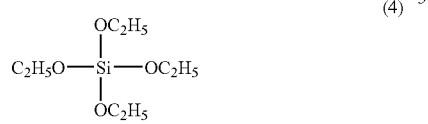

(4)

In this instance, TEOS gas and $O_2$ are used as film-forming gas to form a four-membered ring structure of Si—O bonds in a vapor phase, and an interlayer insulating film 12 is formed by plasma discharge wherein the energy is controlled so that the ring structure of Si—O bonds is maintained while the C—O bonds are partly dissociated. Consequently, the interlayer insulating film 12 which has the four-membered ring structure of Si—O bonds is formed, and C-containing groups in the form of the ethoxy ($C_2H_5O$) group are introduced into the interlayer insulating film 12 at an introduction ratio with which a film strength can be maintained. Accordingly, effects similar to those of the second embodiment can be exhibited.

It is to be noted here that, while the example described above uses TEOS gas, similar effects are achieved also where some other alkoxyl silane such as tetra propoxy silane (TPOS) is used as such gas.

Further, while, in the second embodiment and the modification 2 thereto described above, film forming gas having alkyl silane or alkoxyl silane is used, film-forming gas which has alkyl alkoxyl silane gas wherein both of an alkyl ($C_xH_y$) group and an alkoxyl ($C_xH_yO$) group are bonded to Si may be used. In this instance, since, by using the film-forming gas which contains alkyl alkoxyl silane gas and $O_2$ gas, both of Si—C bonds and C—O bonds are contained in the film-forming gas, the interlayer insulating film 12 is formed by a plasma CVD method wherein the energy is controlled so that the Si—C bonds and the C—O bonds are partly dissociated while the interlayer insulating film 12 has a ring structure of Si—O bonds. Consequently, the interlayer insulating film 12 having a four-membered ring structure of Si—O bonds is formed and C-containing groups including an alkyl ($C_xH_y$) group and an alkoxyl ($C_xH_yO$) group are introduced into the interlayer insulating film 12 at an introduction ratio with which a film strength can be maintained. Accordingly, similar effects to those of the second embodiment can be exhibited.

Such alkyl alkoxyl silane as described above may be methyl methoxy silane, methyl ethoxy silane or dimethyl ethoxy silane.

While preferred embodiments of the present invention have been described using specific terms, such description is for illustrative purposes only, and it is to be understood that changes and variations may be made without departing from the spirit or scope of the following claims.

What is claimed is:

1. A method of manufacturing a semiconductor device, the method comprising the steps of:
   providing a substrate; and
   forming an insulating film from a film-forming gas on the substrate by a plasma process in a chemical vapor deposition (CVD) unit,
   wherein,
   (a) the plasma process comprises the step of forming a plasma of a film-forming gas, the film-forming gas comprising a compound selected from the group consisting of tetraethoxy silane and tetra propoxy silane,
   (b) the plasma is generated by repetitively switching a micro wave on and off set to a power set at about 1000 W and with a duty ratio and an RF power of the CVD unit set to about 1000 W such that a ring structure of Si—O bonds is maintained in the insulating film,
   (c) the plasma process is such that the ring structure of the Si—O bonds is maintained in the insulating film, and
   (d) a maximum of 30% of the Si—C bonds of the compound selected from the group consisting of tetraethoxy silane and tetra propoxy silane are maintained in the insulating film.

* * * * *